United States Patent [19]

Donaldson

[11] Patent Number: 4,926,063
[45] Date of Patent: May 15, 1990

[54] SQUARE ROOT DIGITAL-TO-ANALOG CONVERTER

[75] Inventor: Scott B. Donaldson, Blacksburg, Va.

[73] Assignee: Kollmorgen Corporation, Simsbury, Conn.

[21] Appl. No.: 270,685

[22] Filed: Nov. 14, 1988

[51] Int. Cl.$^5$ .............................................. H03M 1/68
[52] U.S. Cl. .................................... 307/144; 307/145
[58] Field of Search ................................ 341/144, 145

[56] References Cited

U.S. PATENT DOCUMENTS 4,450,433  5/1984  Moriyama ........................... 341/145
4,503,421  3/1985  Hareyama et al. .................. 341/145

OTHER PUBLICATIONS

National Semiconductor Linear Data Book (1982), p. 9–148.

Analog Devices 1984 Data Book, vol. 1, p. 6–26.
Analog Devices 1984 Data Book, vol. 1, p. 6–23.

Primary Examiner—William M. Shoop, Jr.
Assistant Examiner—Sharon D. Logan
Attorney, Agent, or Firm—Morgan & Finnegan

[57] ABSTRACT

A twenty four bit digital-to-analog converter comprising three eight bit digital-to-analog converters. The outputs of the two least significant converters are proportioned and summed together into one amplifier to form a sixteen bit converter. The most significant converter is fed to a separate amplifier. The output of the two amplifiers is summed into a square-root amplifier through various analog switches and summing resistors. Gains at the input and output of the square-root amplifier are altered according to the input level of the digital-to-analog converter in order to optimize the dynamic range and gain requirements.

6 Claims, 1 Drawing Sheet

SQUARE ROOT DIGITAL-TO-ANALOG CONVERTER

BACKGROUND OF THE INVENTION

The present invention relates to digital-to-analog converters. More particularly, the invention relates to digital-to-analog converters for use in electric servo motor positioners.

The digital input to the digital-to-analog (D/A) converter in electric servo motor positioners represents motor position, while the output of the circuit represents a motor velocity command based on motor position. Because velocity is the first time derivative of position, velocity is proportional to the square root of the position if acceleration and deceleration are to remain constant.

The conventional method of taking the square root of an analog voltage presents significant problems in that the voltages and currents from the least significant bit of a 24 bit D/A converter are much smaller than the noise and offset voltages and currents of the operational amplifier in the current-to-voltage converter. Additionally, the dynamic range requirements are too great, typically 0.478 $\mu$V to 8 V. The required gain for the square root amplifier is also too great, typically 4096. Further, because a motor positioner may operate over thousands of revolutions with 4096 discrete positions within a revolution, a 24 bit (16.7 million) dynamic range is required with very high accuracy near zero.

The extreme dynamic range requirements of the 24-bit converter of 0.5 microvolts per bit followed by the extremely high gain requirements of the square-root amplifier (greater than 4000 near zero) make a conventional circuit topology very expensive, if not impossible to implement.

SUMMARY OF THE INVENTION

With the foregoing in mind, it is an object of the invention to provide an inexpensive monotonic 24 bit digital-to-analog converter including a square root transfer function for use in an electric servo motor positioner. The square root transfer function provides both a linearized deceleration profile of the motor and enhanced monotonicity of the D/A converter.

The 24-bit digital-to-analog converter according to the invention comprises three 8-bit digital-to-analog converters. The outputs of the two least significant converters are proportioned and summed together into one amplifier to form a 16-bit converter. The most significant converter is fed to a separate amplifier. The outputs of these two amplifiers are summed into a square-root amplifier through various analog switches and summing resistors. These analog switches may be used to change the gain of the digital-to-analog converter when more than 16 bits are used. In addition to the gain-change in the summing resistors feeding the square-root amplifier, another analog switch may be used to change the gain of an amplifier that follows the square-root amplifier.

The topology of the circuit according to the invention enhances monotonicity by a factor of 16 because the gain change in front of the square-root amplifier is a factor of 256 (8-bits), while the gain change in the amplifier that follows is only 16 (square root of 256). This increases the dynamic range of the gain switch point by a factor of 16. Implementation may be through the use of inexpensive 8-bit digital-to-analog converters and a simple transconductance amplifier used as a multiplier in the feedback loop of the square-root amplifier. Only one trim is necessary.

Thus, combining the requirements of a 24 bit dynamic range and a square root transfer function, a 24-bit digital-to-analog converter may be used with no more dynamic range problems than a 16 bit converter. By nesting the square root amplifier within gain changing networks of the digital-to-analog converter, dynamic range requirements are reduced by a factor of 256 and gain requirements reduced by a factor of 16.

BRIEF DESCRIPTION OF THE DRAWINGS

The accompanying drawing, referred to herein and constituting a part hereof, illustrate a preferred embodiment of the invention and, together with the description, serve to explain the principles of the invention, wherein.

DETAILED DESCRIPTION OF THE DRAWINGS

Figure 1:
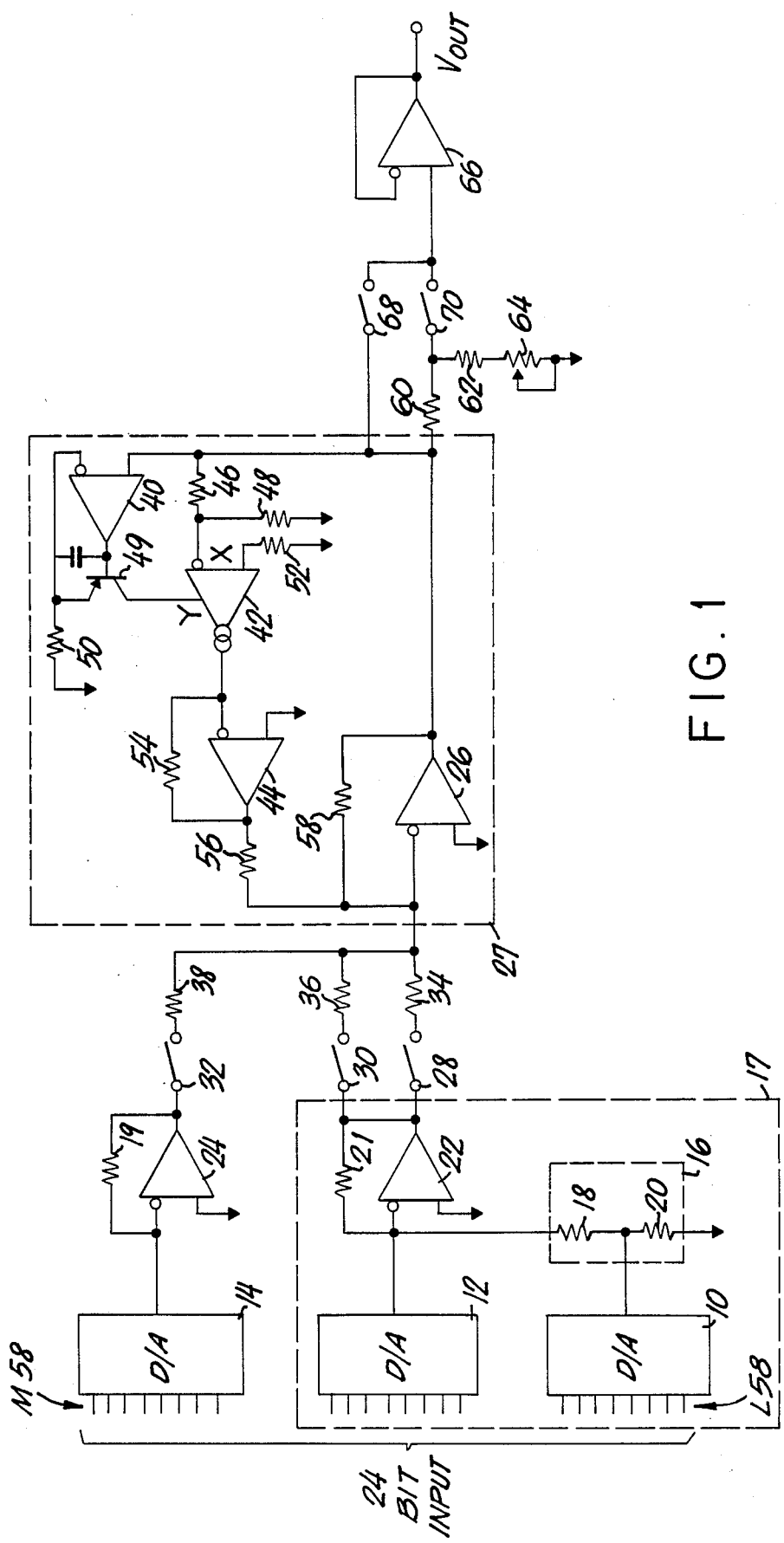
FIG. 1 is a circuit diagram according to the invention.

In the circuit shown in FIG. 1, the 24-bit input represents motor position. It is separated into three 8-bit D/A converters 10, 12, 14 each with a 2 milliamp current sink full scale output. The current output of D/A converter 10 is reduced by a factor of 256 by a resistive current divider 16 comprising resistors 18, 20. Resistors 18, 20 have typical values of 255K and 1K ohms, respectively. The current from the current divider is then summed with the current output of D/A converter 12 at the inverting input of amplifier 22. The combination of D/A converter 10, D/A converter 12, and amplifier 22 forms a 16-bit D/A converter 17 with a full scale output of +8 volts and sensitivity of 122 microvolts per bit at the output of amplifier 22.

The remaining 8 most significant bits are fed into D/A converter 14. Amplifier 24 converts the current output of D/A converter 14 to a +8 volt full scale output with a sensitivity of 31 millivolts per bit. Amplifier 22 should have input offsets of less than 60 microvolts and 15 nanoamperes to keep within half of 1 bit error near zero. Resistors 19, 21 both have typical values of 4 K ohms.

Because the upper 8 and lower 16 bits are converted separately, logic controlled switches 28, 30, 32 along with resistors 34, 36, 38 (having typical values of 4K, 1024K, and 4K ohms, respectively) are used to proportion the voltages from amplifier 22 and amplifier 24 as currents into the square-root amplifier. When the digital input into D/A converter 14 is all zeros, switch 28 is closed while switches 30, 32 are open. In this condition, the D/A converter acts like a 16-bit converter rather than a 24-bit converter, boosting the current input to the square root amplifier 26 by a factor of 256 (2 milliamps full scale). Whenever the 24-bit motor position word exceeds 16 bits and ones begin to appear at the input of D/A converter 14, switch 28 opens and switches 30, 32 close. Resistor 38 allows amplifier 24 to feed 2 milliamps full scale into amplifier 26 while resistor 36 allows amplifier 22 to feed 2/256 of a milliamp into amplifier 26. This allows the D/A converter to act as a true 24-bit converter, but only after the lowest 16 bits have overflowed. At the crossover point, the input current to amplifier 26 is 7.8 microamps, or, 1/256 times full scale input of 2 milliamps.

Amplifiers 26, 40, 42, 44 comprise square-root amplifier 27. Amplifier 26 forms the main feed-forward amplifier with its inverting input as the summing junction for input current from amplifier 22 and amplifier 24 and the feedback current from amplifier 44. Full scale feedback and input current is 2 milliamps. Full scale output is −8 volts.

Amplifiers 40, 42 form an analog multiplier used in a squaring configuration. Amplifier 42 is a transconductance amplifier with a full scale X input of 50 millivolts from the voltage divider including resistors 46, 48 (having typical values of 16K and 100 ohms, respectively), a full scale Y input of 0.5 milliamps from current source amplifier 40, transistor 49, and resistor 50 (having a typical value of 16K ohms), and a full scale output of −0.5 milliamps. Resistor 52 (having a typical value of 100 ohms) is used to balance the input impedance of amplifier 42. Amplifier 40, transistor 49 and resistor 50 provide a current to the Y port of amplifier 42 that is proportional to the output voltage of amplifier 26. Because the X and Y inputs of amplifier 42 are both proportional to the output voltage of amplifier 26, and because the output current of amplifier 42 is proportional to the product of its X and Y inputs, the output current of amplifier 42 is proportional to the square of the voltage from amplifier 26. Amplifier 44, resistors 54, 56 (having typical values of 16K and 4K, respectively) invert and boost the full scale output current of −0.5 milliamps from amplifier 42 to +2 milliamps back to the summing junction of amplifier 26. This squaring circuit in the feedback path of amplifier 26 causes the transfer function of amplifier 26 to be a square-root transfer function. Resistor 58 (having a typical value of 1024K ohms) limits the gain of amplifier 26 near zero input to 256, or less.

Because the D/A converter boosts its output to the square-root amplifier by a factor of 256 when the upper 8 bits are zero (switch 28 closed), the output of the square-root amplifier should be attenuated. This is performed by resistors 60, 62 (having typical values of 15K and 750 ohms respectively), and potentiometer 64 (having a typical value of 250 ohms). Potentiometer 64 may be used to match the input level of amplifier 66 when switches 68, 70 change state. This assures monotonic operation. If amplifier 26 were a linear amplifier rather than a square-root amplifier, the attenuation would need to be 1/256, causing sub-microvolt/bit inputs to output amplifier 66 when logic controlled switch 68 is closed. However, because amplifier 26 has a square-root transfer function, the attenuation need only be a factor of 16 (square root of 256), allowing much larger signals at the input to amplifier 66.

When the digital input exceeds 16 bits, logic controlled switch 70 opens and switch 68 closes, allowing 24 bit operation with no gain boost in front of amplifier 26 and no attenuation after amplifier 26. The gain change occurs when the digital input is full scale (FFFFFF Hex) divided by 256, which is 00FFFF Hex. The corresponding voltage at the output is −8 volts (full scale) divided by the square root of 256, which is −8/16, or −0.5 volt.

As will be appreciated from the foregoing, the operation of the converter is as follows: when the digital input is 16 bits or less, switches 28, 70 are closed; all others are open. The system acts like a 16 bit square root D/A converter with a 1/16 attenuator at the output. When the digital input exceeds 16 bits (greater than or equal to 010000 Hex), all switches change state and the converter acts like a 24 bit converter. It will also be appreciated that input gain switches by a factor of 256, while output make-up gain is only 16.

Accordingly, the instant invention provides an improved method of taking the square root of the analog voltage from a 24 bit D/A converter. A significant advantage of the converter according to the instant invention is that dynamic range requirements of the amplifiers used in the current-to-voltage converters and square root amplifier are greatly relieved by use of gain-change switches. The smallest current may be raised from 0.1192 $\mu$A to 30.5 $\mu$A (a 256:1 improvement). The smallest voltage may be raised from 0.478 $\mu$V to 122 $\mu$V (a 256:1 improvement), while the output gain change is only 16:1 due to square root transfer function. The gain required in the square root amplifier has been reduced from 4096 to 256 (a 16:1 improvement).

While the invention has been described in its preferred embodiment, it is to be understood that the words which have been used are words of description, rather than limitation, and that changes may be made within the purview of the appended claims without departing from the true scope and spirit of the invention in its broader aspects.

What is claimed:

1. A digital-to-analog converter, comprising:
   (a) first and second digital-to-analog converters;
   (b) a first amplifier for amplifying the sum of the outputs of said first and second digital-to-analog converters;
   (c) a third digital-to-analog converter;
   (d) a second amplifier for amplifying the output of said third digital-to-analog converter; and
   (e) a square-root amplifier for amplifying the sum of the outputs of said first and second amplifiers.

2. A digital-to-analog converter according to claim 1, further comprising means for adjusting the gain of the digital-to-analog converter.

3. A digital-to-analog converter according to claim 1, wherein said first, second, and third digital-to-analog converters each comprise an eight bit digital-to-analog converter.

4. A digital-to-analog converter according to claim 1, further comprising means for proportioning the outputs of said first and second digital-to-analog converters.

5. A digital-to-analog converter according to claim 1, further comprising a third amplifier for amplifying the output of said square-root amplifier.

6. A digital-to-analog converter according to claim 5, further comprising means for adjusting the gain of said third amplifier.

* * * * *